United States Patent
Koo et al.

(10) Patent No.: US 11,497,141 B2
(45) Date of Patent: Nov. 8, 2022

(54) HEAT DISSIPATION DEVICE FORMED OF NONMETALLIC MATERIAL AND ELECTRONIC DEVICE INCLUDING THE SAME

(71) Applicant: Samsung Electronics Co., Ltd., Gyeonggi-do (KR)

(72) Inventors: Kyungha Koo, Gyeonggi-do (KR); Kuntak Kim, Gyeonggi-do (KR); Jihong Kim, Gyeonggi-do (KR); Hongki Moon, Gyeonggi-do (KR); Hajoong Yun, Gyeonggi-do (KR); Haejin Lee, Gyeonggi-do (KR); Seyoung Jang, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 73 days.

(21) Appl. No.: 16/577,835

(22) Filed: Sep. 20, 2019

(65) Prior Publication Data

US 2020/0100390 A1    Mar. 26, 2020

(30) Foreign Application Priority Data

Sep. 20, 2018   (KR) .................. 10-2018-0113215

(51) Int. Cl.
  *H05K 7/20* (2006.01)
  *F28F 21/06* (2006.01)
  *F28D 15/04* (2006.01)

(52) U.S. Cl.
  CPC ....... *H05K 7/20336* (2013.01); *F28D 15/046* (2013.01); *F28F 21/06* (2013.01); *F28F 2245/00* (2013.01)

(58) Field of Classification Search
  CPC .. H05K 7/20336; F28F 21/06; F28F 2245/00; F28F 2275/02; F28D 15/046;
  (Continued)

(56) References Cited

U.S. PATENT DOCUMENTS 10,141,625 B1 * 11/2018 Ryu ..................... H05K 7/2039
2004/0035558 A1 * 2/2004 Todd ..................... H01L 23/367
                                                      165/104.26
(Continued)

FOREIGN PATENT DOCUMENTS

JP    2004-022681    1/2004
JP    2006-261472    9/2006
(Continued)

OTHER PUBLICATIONS

International Search Report dated Jan. 10, 2020 issued in counterpart application No. PCT/KR2019/012144, 8 pages.
(Continued)

*Primary Examiner* — Harry E Arant
(74) *Attorney, Agent, or Firm* — The Farrell Law Firm, P.C.

(57) ABSTRACT

A heat dissipation device is provided. The heat dissipation device includes a container including a first plate, and a second plate spaced apart from the first plate to define an interior space, at least one filler disposed between the first plate and the second plate and configured to support the first plate and the second plate, a wick layer located on an inner wall defined in the interior space by the first plate or the second plate, and a working fluid configured to flow in the interior space in a gaseous state, and flow in the wick layer in a liquefied state, wherein the container further includes a fluoride-based polymer having a predetermined gas permeability.

19 Claims, 14 Drawing Sheets

(58) Field of Classification Search
CPC .. F28D 15/0283; F28D 15/0233; G06F 1/203; H04M 1/026
See application file for complete search history.

(56) References Cited

U.S. PATENT DOCUMENTS

| | | | |
|---|---|---|---|
| 2004/0069459 A1 | 4/2004 | Tonosaki et al. | |
| 2004/0211549 A1* | 10/2004 | Garner | F28D 15/0233 165/104.26 |
| 2007/0240860 A1* | 10/2007 | Meyer | F28D 15/0233 165/104.26 |
| 2007/0295494 A1 | 12/2007 | Mayer et al. | |
| 2009/0040726 A1* | 2/2009 | Hoffman | F28D 15/0233 361/700 |
| 2010/0053899 A1* | 3/2010 | Hashimoto | H01L 23/373 361/701 |
| 2010/0186931 A1 | 7/2010 | Obara et al. | |
| 2011/0017431 A1 | 1/2011 | Yang et al. | |
| 2011/0120674 A1* | 5/2011 | MacDonald | F28D 15/04 165/104.26 |
| 2014/0083653 A1* | 3/2014 | Kempers | F28D 15/046 165/104.26 |
| 2015/0204617 A1 | 7/2015 | Thanhlong et al. | |
| 2019/0281729 A1 | 9/2019 | Inagaki et al. | |

FOREIGN PATENT DOCUMENTS

| | | |
|---|---|---|
| JP | 2018-091512 | 6/2018 |
| KR | 100795753 | 1/2008 |
| KR | 100809587 | 3/2008 |
| KR | 1020120015832 | 2/2012 |

OTHER PUBLICATIONS

European Search Report dated Oct. 6, 2021 issued in counterpart application No. 19862125.2-1002, 86 pages.

\* cited by examiner

HEAT DISSIPATION DEVICE FORMED OF NONMETALLIC MATERIAL AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2018-0113215, filed on Sep. 20, 2018, in the Korean Intellectual Property Office, the disclosure of which is incorporated by reference herein in its entirety.

BACKGROUND

1. Field

The disclosure relates generally to a heat dissipation device including a nonmetallic material, and more particularly, to an electronic device including the same.

2. Description of Related Art

An electronic device may employ high-performance electronic components for realizing high-quality content delivery and high-performance applications. Electronic devices are realized in various sizes according to functions thereof and preferences of users, and may be designed in consideration of performance and slimness of the electronic devices.

Electronic devices may generate a considerable amount of heat because slimmed high-performance electronic devices are mounted on the electronic devices. Because a small-scale electronic device directly contacts a user, the user may feel uncomfortable due to heat generated by the electronic device.

In order to reduce heat emission from electronic devices, heat dissipation devices for reducing heat emission from the electronic devices have been developed.

A heat dissipation device for dissipating heat from an electronic device may utilize a heat sink or a heat pipe formed of a metal for high heat dissipation performance. The heat dissipation device formed of a metallic material may increase the weight of the electronic device due to the high specific gravity of the metallic material. When the heat dissipation device is mounted on an electronic device, an operational part of the electronic device may be damaged due to low flexibility thereof. When a heat dissipation device is formed of a metallic material, the heat dissipation device may deteriorate radiation performance of an antenna or decrease wireless charging efficiency of an electronic device.

SUMMARY

An aspect of the present disclosure provides a heat dissipation device which is flexible, and can secure heat transfer ability without influencing an electromagnetic field, and an electronic device including the same.

Another aspect of the present disclosure provides a heat dissipation device made of a nonmetallic material and an electronic device including the same may be applied to a flexible device due to its flexibility, and is capable of maintaining heat dissipation performance, wherein the heat dissipation device does not influence an electronic component that utilizes an electromagnetic field.

In accordance with an aspect of the disclosure, a heat dissipation device is provided. The heat dissipation device includes a container including a first plate, and a second plate spaced apart from the first plate to define an interior space, at least one filler disposed between the first plate and the second plate and configured to support the first plate and the second plate, a wick layer located on an inner wall defined in the interior space by the first plate or the second plate, and a working fluid configured to flow in the interior space in a gaseous state, and flow in the wick layer in a liquefied state, wherein the container further includes a fluoride-based polymer having a predetermined gas permeability.

In accordance with another aspect of the disclosure, an electronic device is provided. The electronic device includes an electronic component configured to generate heat during an operation thereof, and a heat dissipation device contacting a heat emitting area of the electronic component, wherein the heat dissipation device includes a container including a first plate, a second plate spaced apart from the first plate to define an interior space, and a fluoride-based polymer having a predetermined gas permeability, at least one filler disposed between the first plate and the second plate and configured to support the first plate and the second plate, a wick layer located on an inner wall defined in the interior space by the first plate or the second plate, and a working fluid configured to flow in the interior space in a gaseous state, and flow in the wick layer in a liquefied state.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
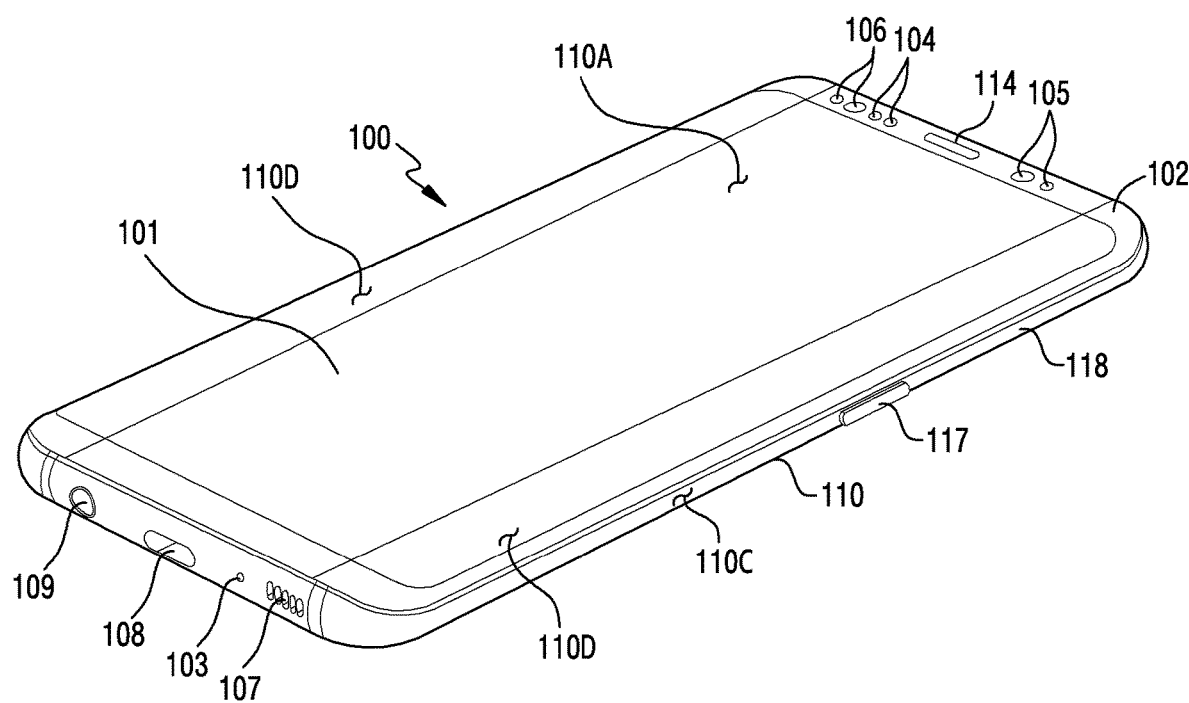
FIG. 1 is a perspective view of a front surface of a mobile electronic device according to an embodiment.
Figure 2:
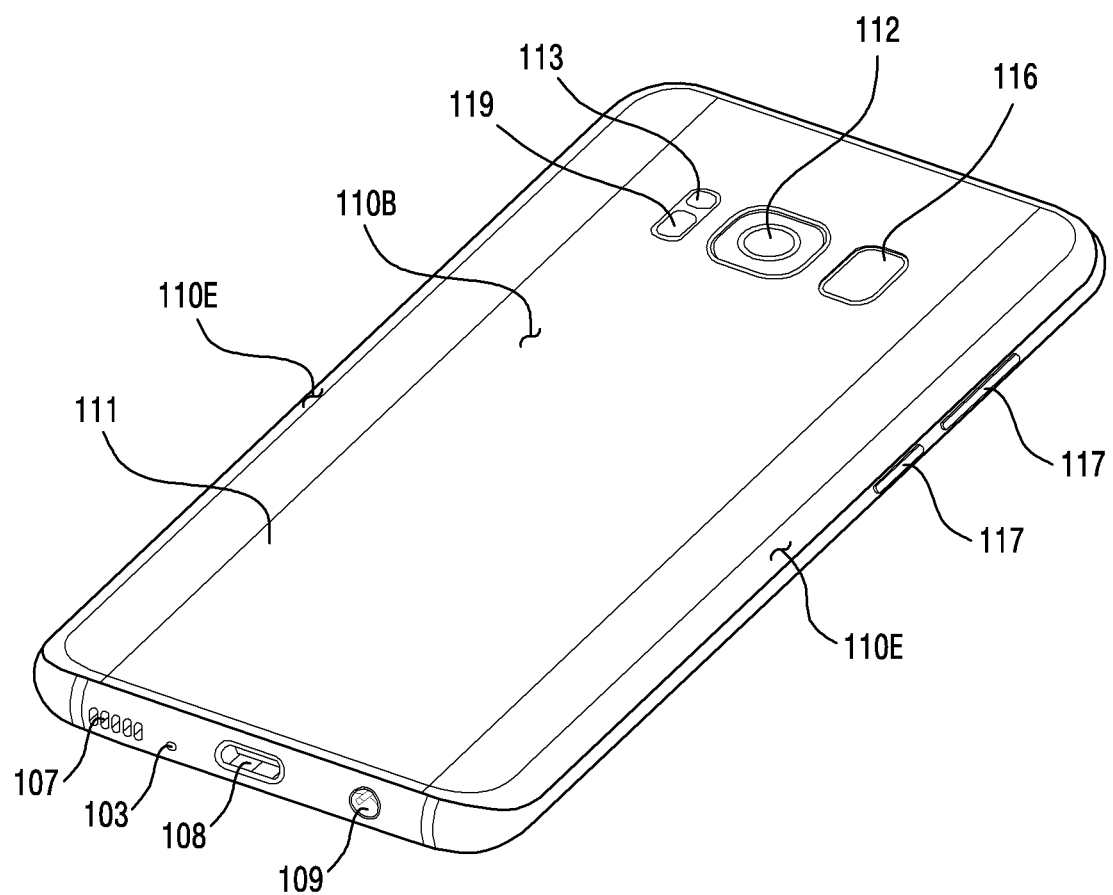
FIG. 2 is a perspective view of a rear surface of the electronic device of FIG. 1 according to an embodiment.

Referring to FIGS. 1 and 2, an electronic device 100 according to an embodiment may include a housing 110 including a first surface (or a front surface) 110A, a second surface (or a rear surface) 110B, and side surfaces 110C that surrounds a space between the first surface 110A and the second surface 110B. In another embodiment, the housing 110 may refer to a structure that defines some of the first surface 110A, the second surface 110B, and the side surfaces 110C of FIG. 1. The first surface 110A may be defined by a front plate 102 (e.g., a glass plate or a polymer plate including various coating layers), at least a portion of which is substantially transparent. The second surface 110B may be formed by a rear plate 111 that is substantially opaque. The rear plate 111, for example, may be formed of coated or colored glass, ceramics, a polymer, a metal (e.g., aluminum, stainless steel (STS), or magnesium), or a combination of at least two thereof. The side surfaces 110C are coupled to the front plate 102 and the rear plate 111, and may be formed by a side bezel structure (or a side member) 118 including a metal and/or a polymer. The rear plate 111 and the side bezel structure 118 may be integrally formed and may include the same material (e.g., a metallic material such as aluminum).

The front plate 102 may include two first areas 110D that are deflected from the first surface 110A toward the rear plate 111 and extend seamlessly, at opposite ends of a long edge of the front plate 102. The rear plate 111 may include two second areas 110E that are deflected from the second surface 110B toward the front plate 102 and extend seamlessly, at opposite ends of a long edge of the rear plate 111. The front plate 102 (or the rear plate 111) may include only one of the first areas 110D (or the second areas 110E). Some of the first areas 110D or the second areas 110E may be omitted. When viewed from a side of the electronic device 100, the side bezel structure 118 may have a first thickness (or width) on the side surfaces on which neither the first areas 110D nor the second areas 110E are included, and may have a second thickness that is less than the first thickness on the side surfaces on which the first areas 110D or the second areas 110E are included.

The electronic device 100 may include at least one of a display 101, audio modules 103, 107, and 114, sensor modules 104, 116, and 119, camera modules 105, 112, and 113, a key input device 117, a light emitting element 106, and connector holes 108 and 109. At least one (e.g., the key input device 117 or the light emitting element 106) of the elements may be omitted from the electronic device 100 or another element may be additionally included in the electronic device 100.

The display 101, for example, may be exposed through a corresponding portion of the front plate 102. At least a portion of the display 101 may be exposed through the front plate 102 that defines the first surface 110A, and the first areas 110D of the side surfaces 110C. Corners of the display 101 may have shapes that are substantially the same as the adjacent outer shape of the front plate 102. In order to expand the area by which the display 101 is exposed, the intervals between the outskirts of the display 101 and the outskirts of the front plate 102 may be substantially the same.

A portion of the screen display area of the display 101 may have a recess or an opening, and may include at least one of the audio module 114, the sensor module 104, the camera module 105, and the light emitting element 106, which are aligned with the recess or the opening. At least one of the audio module 114, the sensor module 104, the camera module 105, the fingerprint sensor 116, and the light emitting element 106 may be included on the rear surface of the screen display area of the display 101. The display 101 may be coupled to or be disposed to be adjacent to a touch detection circuit, a pressure sensor that may measure the strength (e.g., pressure) of a touch, and/or a digitizer that detects a stylus pen of a magnetic field type. At least a portion of the sensor modules 104 and 119 and/or at least a portion of the key input device 117 may be disposed in the first areas 110D and/or the second areas 110E.

The audio modules 103, 107, 114 may include a microphone hole 103 and speaker holes 107 and 114. A microphone for acquiring external sounds may be disposed in the microphone hole 103, and a plurality of microphones may be disposed to detect a direction of a sound. The speaker holes 107 and 114 may include an external speaker hole 107 and a communication receiver hole 114. The speaker holes 107 and 114 and the microphone hole 103 may be realized by one hole or a speaker may be included while the speaker holes 107 and 114 are not employed (e.g., a piezoelectric speaker).

The sensor modules 104, 116, and 119 may generate an electrical signal or a data value corresponding to an operational state of the interior of the electronic device 100 or an environmental state of the outside of the electronic device. The sensor modules 104, 116, and 119, for example, may include a first sensor module 104 (e.g., a proximity sensor) and a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed not only on the first surface 110A (e.g., the display 101) but also the second surface 110B of the housing 110. The electronic device 100 may further include a sensor module, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera modules 105, 112, and 113 may include a first camera device 105 disposed on the first surface 110A of the electronic device 100, and a second camera device 112 and/or a flash 113 disposed on the second surface 110B. The camera devices 105 and 112 may include one or a plurality of lenses, an image sensor, and/or an image signal processor. The flash 113, for example, may include a light emitting diode (LED) or a xenon lamp. Two or more lenses (an IR ray camera, and a wide angle/telephoto lens), and image sensors may be disposed on one surface of the electronic device 100.

The key input devices 117 may be disposed on the side surfaces 110C of the housing 110. The electronic device 100 may omit some or all of the above-mentioned key input devices 117 and the key input devices 117 which are omitted, may be realized in different forms, such as a soft key, on the display 101. The key input device may include a sensor module 116 disposed on the second surface 110B of the housing 110.

The light emitting element 106, for example, may be disposed on the first surface 110A of the housing 110. The light emitting element 106, for example, may provide state information on the electronic device 100 in the form of light.

The light emitting element 106, for example, may provide a light source that interoperates with an operation of the camera module 105. The light emitting element 106, for example, may include an LED, an IR LED, and a xenon lamp.

The connector holes 108 and 109 may include a first connector hole 108 that may receive a connector (e.g., a universal serial bus (USB) connector) for transmitting and receiving electrical power and/or data to and from an external electronic device, and/or a second connector hole (e.g., an earphone jack) 109 that may receive a connector for transmitting and receiving an audio signal to and from the external electronic device.

Figure 3:
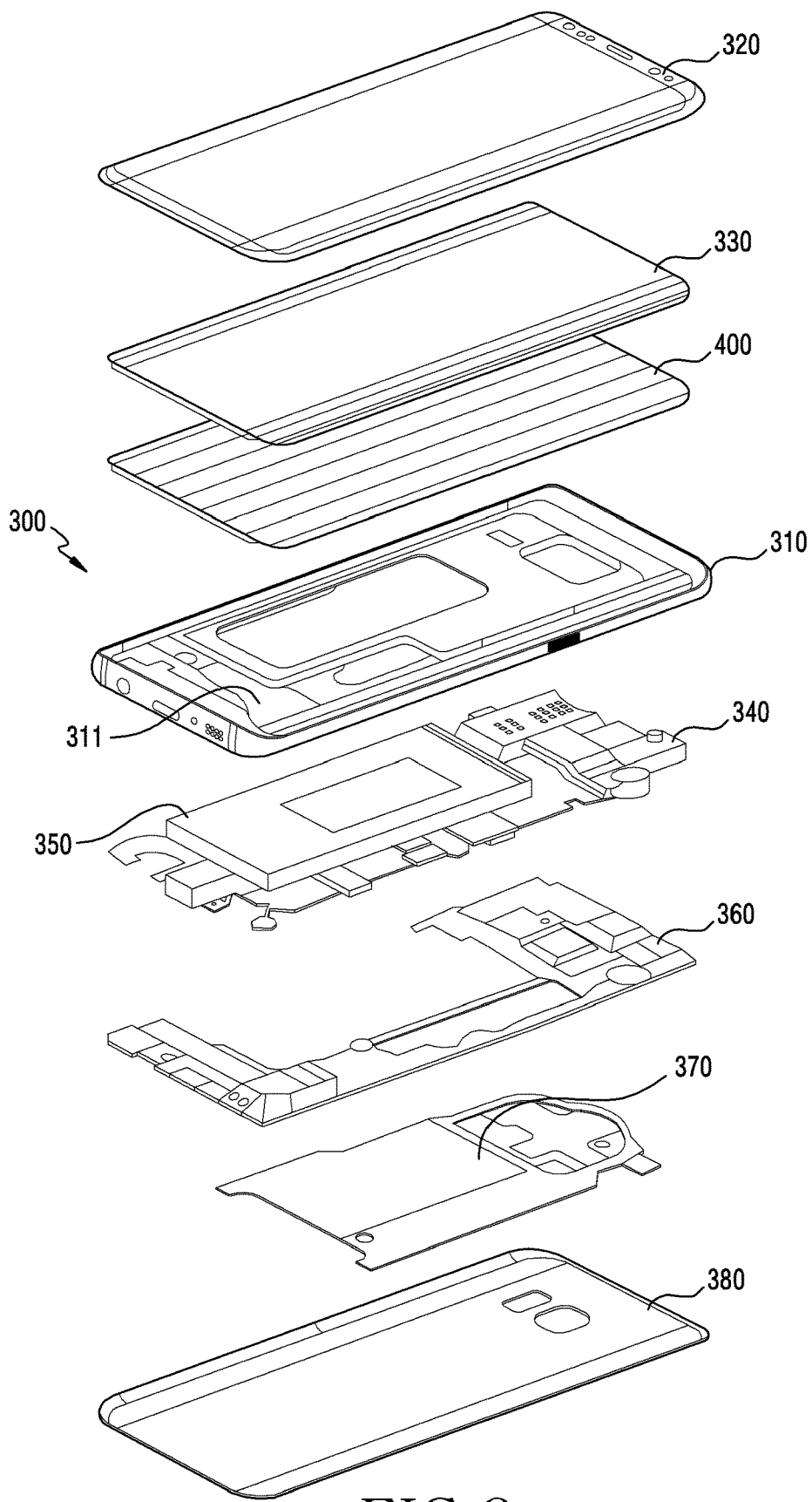
FIG. 3 is an exploded perspective view of the electronic device of FIG. 1 according to an embodiment.

FIG. 3 is an exploded perspective view of an electronic device 300 (e.g., the electronic device 100 of FIG. 1) according to an embodiment.

Referring to FIG. 3, the electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. At least one (e.g., the first support member 311 or the second support member 360) of the elements may be omitted from the electronic device 300 or another element may be additionally included in the electronic device 300. At least one of the elements of the electronic device 300 may be the same as or similar to at least one of the elements of the electronic device 100 of FIGS. 1 and 2, and a repeated description thereof is omitted here.

The first support member 311 may be disposed in the interior of the wearable electronic device 300 to be connected to the side bezel structure 310 or to be integrally formed with the side bezel structure 310. The first support member 311, for example, may be formed of a metallic material and/or a nonmetallic material (e.g., a polymer). The display 330 may be coupled to one surface of the first support member 311, and the printed circuit board 340 may be coupled to an opposite surface of the first support member 311. A processor, a memory, and/or an interface may be mounted on the printed circuit board 340. The processor, for example, may include one or more of a central processing unit (CPU), an application processor (AP), a graphic processing unit (GPU), an image signal processor (ISP), a sensor hub process, or a communication processor (CP).

The memory, for example, may include a volatile and/or nonvolatile memory.

The interface, for example, may include a high definition multimedia interface (HDMI), a USB interface, a secure date (SD) card interface, and/or an audio interface. The interface, for example, may electrically or physically connect the electronic device 300 to an external electronic device, and may include a USB connector, an SD card/ multimedia card (MMC) connector, and an audio connector.

The battery 350 is a device for supplying electrical power to at least one element of the electronic device 300, and, for example, may include a primary battery that cannot be recharged, a secondary battery that may be recharged, or a fuel cell. At least a portion of the battery 350, for example, may be disposed on substantially the same plane as the printed circuit board 340. The battery 350 may be integrally disposed in the interior of the electronic device 300, and may be disposed to be detachable from the electronic device 300.

The antenna 370 may be disposed between the rear plate 380 and the battery 350. The antenna 370, for example, may include a near field communication (NFC) antenna, a wireless charging antenna, and/or a magnetic secure transmission (MST) antenna. The antenna 370, for example, may perform short-range communication with an external device, or may wirelessly transmit and receive electrical power that is necessary for charging. An antenna structure may be formed by one or a combination of the side bezel structure 310 and/or the first support member 311.

The electronic device 300 may further include a heat dissipation device 400. The heat dissipation device 400 may be disposed under the display 330, and may be mounted in the interior of the electronic device 300. In order to dissipate heat generated by the display 300, the heat may be dissipated through the heat dissipation device 400. The heat dissipation device 400 may transfer heat by injecting a small amount of working fluid into a closed container and vacuuming the interior of the container, and through a continuous phase change process of evaporating the fluid when heat is absorbed, and condensing the fluid when the heat is dissipated. An additional heat dissipating member may be disposed between the heat dissipation device 400 and the display 300. The additional heat dissipating member may include graphite having an excellent heat dissipation performance.

An electronic device according to various embodiments disclosed herein may be various types of devices. The electronic devices, for example, may include a portable communication device (e.g., a smart phone), a computer, a portable multimedia device, a portable medical device, a camera, a wearable device, or a home appliance. However, the electronic devices are not limited to those described above.

The present disclosure and the terms used therein are not intended to limit the technological features set forth herein to particular embodiments but are intended to include various changes, equivalents, or replacements for a corresponding embodiment. With regard to the description of the corresponding drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "$1^{st}$," "$2^{nd}$," "first," and "second" may be used to simply distinguish a corresponding component from another, but does not limit the components in other aspect (e.g., importance or order). It is to be understood that if an element (e.g., a first element) is referred to, with or without the term "operatively" or "communicatively", as "coupled with" or "connected with", it indicates that the element may be coupled with the other element directly (e.g., by wire), wirelessly, or via a third element.

Figure 4A:
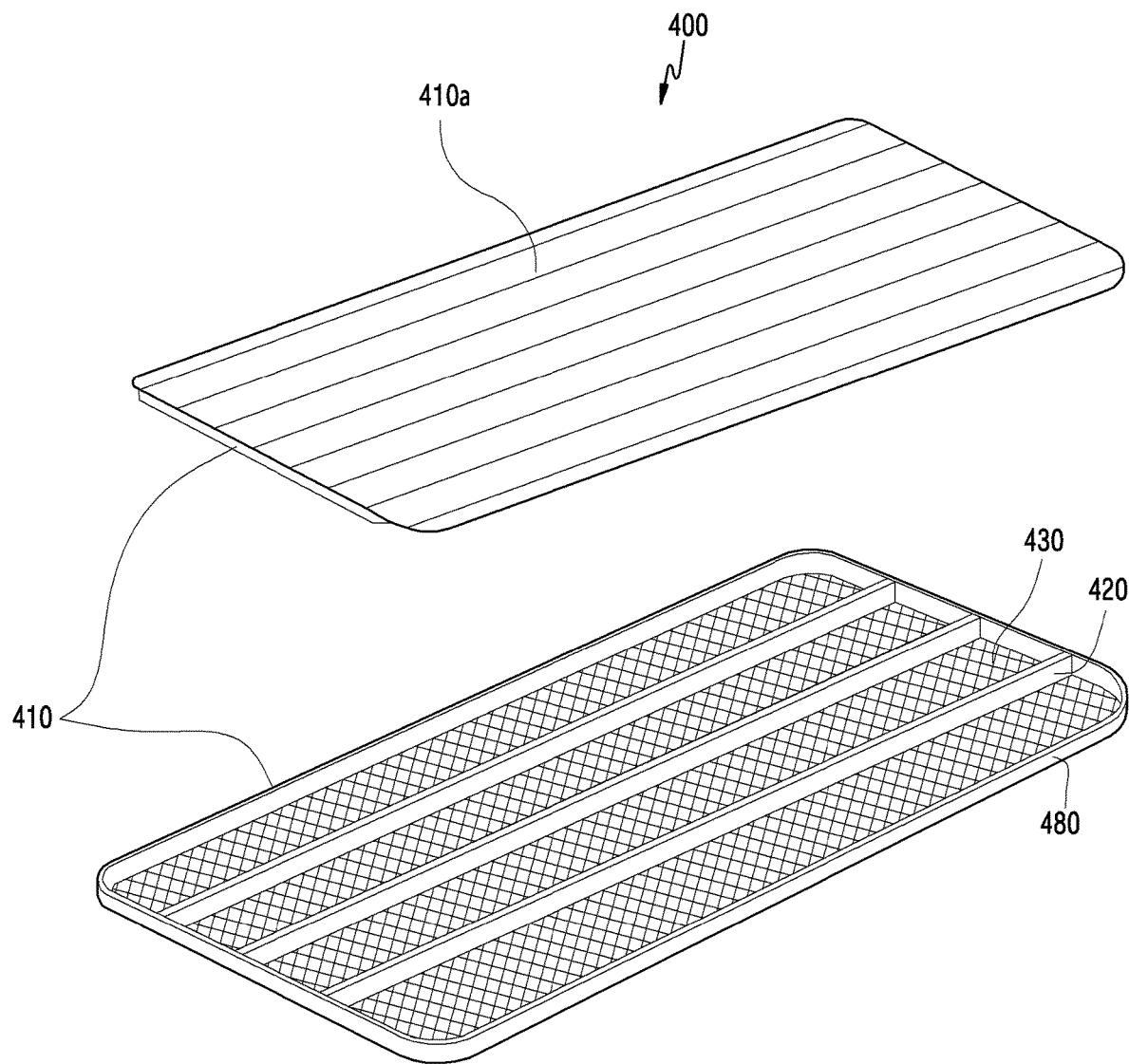
FIG. 4A is an exploded perspective view of a heat dissipation device according to an embodiment.
Figure 4B:
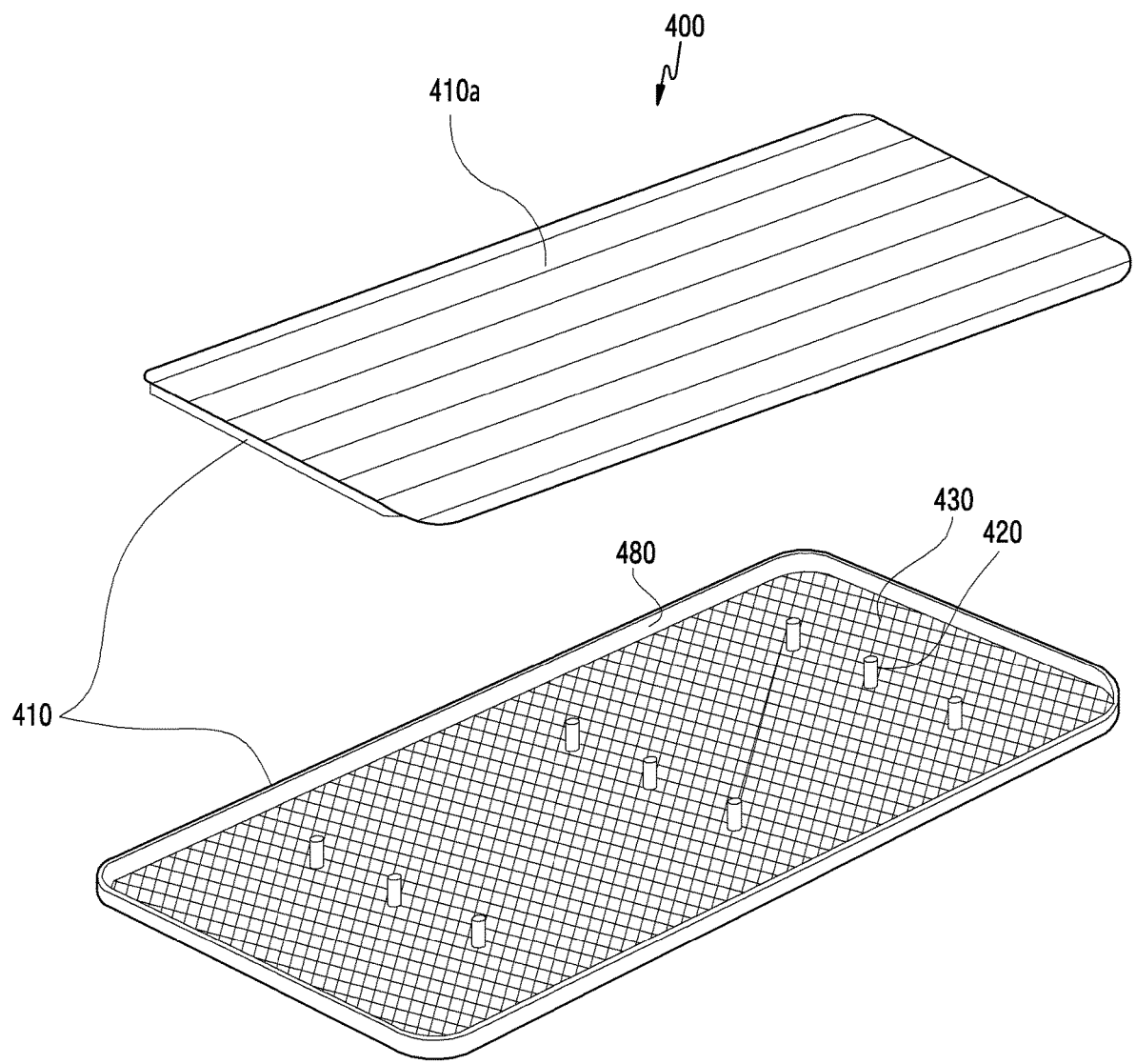
FIG. 4B is an exploded perspective view of a heat dissipation device according to an embodiment.
Figure 4C:
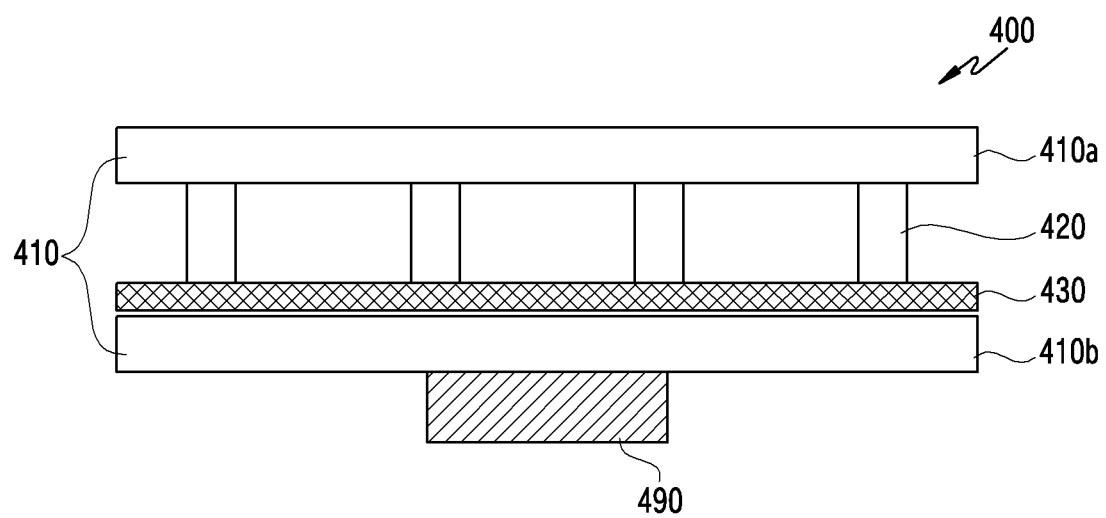
FIG. 4C is a cross-sectional view of a heat dissipation device according to an embodiment.
Figure 4D:
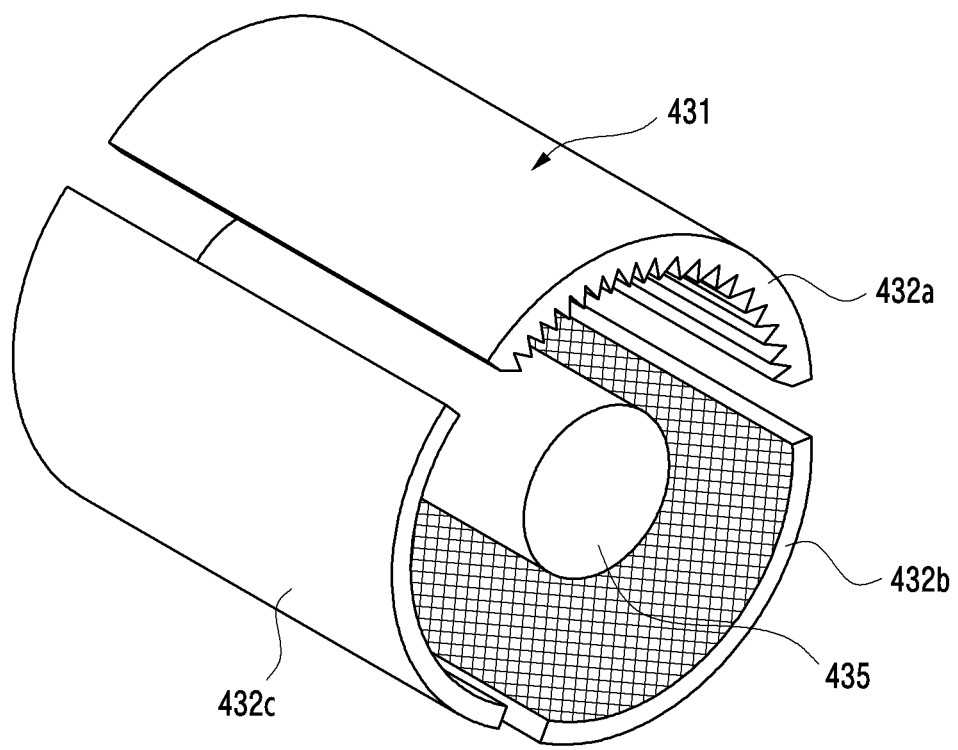
FIG. 4D is a view illustrating a wick structure according to an embodiment.

FIG. 4A is an exploded perspective view of a heat dissipation device according to an embodiment. FIG. 4B is an exploded perspective view of a heat dissipation device according to an embodiment. FIG. 4C is a cross-sectional view of a heat dissipation device according to an embodiment. FIG. 4D is a view illustrating a wick structure according to an embodiment.

Referring to FIGS. 4A and 4B, the heat dissipation device 400 may include a container 410, a filler 420, and a wick layer 430.

The container 410 may include a first plate 410a, a side surface 480, and a second plate in which the wick layer 430 is disposed. The first plate 410a and the second plate are spaced apart from each other to define an interior space. The interior space may be closed from the outside by the side surface 480 disposed along the edges of the first plate 410*a* and the second plate. The container 410 may include a working fluid in the interior thereof.

The wick layer 430 is disposed on the inner surface of the container 410, and may be disposed in the second plate, which is opposite to the first plate 410*a*. When the working fluid is in a liquefied state, it may flow in the wick layer 430, and when the working fluid is in a gaseous state, it may flow in the interior space with no wick layer 430.

As illustrated in FIG. 4A, the plurality of fillers 420 may be disposed parallel to one side surface 480 of the container 410. The fillers 420 may prevent deflection of the first plate 410*a* and the second plate, and may define a movement path of the working fluid in the gaseous state. The plurality of fillers 420 may be disposed parallel to one surface disposed at a long corner of the container 410, but the present disclosure is not limited thereto and the plurality of fillers 420 may be disposed parallel to a short corner.

As illustrated in FIG. 4B, column-shaped fillers 420 may be disposed in the interior of the container 410. The number and locations of fillers 420 may be selected to prevent deflection (or deformation) of the first plate 410*a* and the second plate.

Referring to FIG. 4C, the heat dissipation device 400 may include a container 410, a filler 420, and a wick layer 430.

The heat dissipation device 400 may include a working fluid that flows in the interior space. The working fluid is evaporated from a liquefied state to a gaseous state when absorbing heat in the closed container 410, and may be condensed from the gaseous state to the liquefied state when dissipating heat. The working fluid may transfer heat through a change in the phase thereof. A condensable gas that may easily undergo a phase change may be utilized as the working fluid.

The working fluid may be selected in consideration of a usage temperature of an electronic device, and the materials of the container 410, the fillers 420, and the wick 430 that are applied. The working fluid may be selected in consideration of a temperature at which a phase change occurs according to a usage temperature of the electronic device. The working fluid, which may be evaporated at the temperature that may be generated during operation of the electronic device 300 according to the phase change temperature due to the internal pressure of the heat dissipation device 400, may absorb heat while being evaporated, and may lower the temperature of the electronic device 400. The working fluid may be chemically resistant to the materials of the container 410, the filler 420, and the wick 430. If a non-condensable gas is generated as the container 410, the fillers 420, and the wick 430 constituting the heat dissipation device 400 react with the working fluid, the continuous phase change may be lowered and heat dissipation efficiency may be lowered. The working fluid may be selected from engineering fluids having excellent chemical resistances.

The container 410 may include a first plate 410*a* and a second plate 410*b*. The first plate 410*a* may be disposed to be spaced apart from the second plate 410*b*, and an interior space may be defined between the first plate 410*a* and the second plate 410*b*. A side surface may be defined along the edges of the first plate 410*a* and the second plate 410*b*.

A working fluid may be disposed in the interior space of the container 410. The container 410 may be disposed to have a low gas permeability, and the container 410 having the low gas permeability may maintain the interior space in a vacuum state. The water vapor transmission rate (WVTR) of the container 410 may be $10^{-3}$ g/m$^2$/day or less. The working fluid may generate a non-condensable gas through contact with the first plate 410*a* and the second plate 410*b* that define an inner wall of the container 410. The non-condensable gas requires a pressure condition as well as a temperature condition for a phase change, and may suppress a continuous phase change of the working fluid.

The first plate 410*a* and the second plate 410*b* that define the container 410 may be formed of a polymer having a low gas permeability and having no chemical reaction. When the container 410 including the first plate 410*a* and the second plate 410*b* is formed of a material having a low chemical reactivity, the amount of the non-condensable gas generated by the working fluid may be reduced.

The materials of the first plate 410*a*, the second plate 410*b*, and the side surface 480 that define the container 410 may include a barrier film to decrease gas permeability. The barrier film may be used to protect the organic or nonorganic nano materials of an organic LED (OLED) display and a solar cell that is vulnerable to moisture or oxygen, and may be used to maintain the freshness of foods. The container 410 may use silicon dioxide ($SiO_2$), or a polymeric oxide compound that are the material of a coating film of a barrier film. The inner wall of the container 410 may include a barrier film, a fluoride-based polymer such as polyvinylidene fluoride (PVDF). A barrier film may be coated on the inner wall of the container 410.

The filler 420 may function to support the first plate 410*a* and the second plate 410*b*. Because the first plate 410*a* and the second plate 410*b* are formed of a flexible polymeric material, they may be deflected after being used for a long time. In order to prevent deflection of the first plate 410*a* and the second plate 410*b*, the fillers 420 may be disposed in the interior space, and may be bonded to the first plate 410*a* and the second plate 410*b*.

The fillers 420 may define vapor paths for smooth flow of the working fluid. The fillers 420 may divide the interior space defined by the first plate 410*a* and the second plate 410*b*, which are spaced apart from each other. The fillers 420 may be disposed parallel to the side surface 480 disposed at the edges of the first plate 410*a* and the second plate 410*b*. The fillers 420 may extend in the form of partition walls, and the interior space divided by the fillers 420 may be utilized as movement paths of the fluid in the gaseous state.

The fillers 420 may be manufactured of the material of the barrier film that is the same as the material of the container 410 and a polymer exhibiting a chemical resistance. In detail, the first plate 410*a*, the second plate 410*b*, and the fillers 420 may be formed of a fluoride resin, a ceramic resin, or an epoxy.

The wick 430 may feed the working fluid in the liquefied state through a capillary phenomenon. The wick 430 may be configured to have a structure that defines a fine space in the interior thereof. The wick 430 may be formed of a polymeric material, and the surface of the wick 430 may be treated to secure chemical resistance through ceramic coating ($SiO_2$ coating) or deposition of the surface of the wick 430 to reduce a chemical reaction with the working fluid.

A heat source 490 may be disposed under the second plate 410*b* in which the wick 430 is disposed. The heat source 490 may be disposed on the first plate 410*a* if the wick 430 is disposed in the first plate 410*a*. The heat source 490 may be disposed to contact a display 330 that emits a large amount of heat in the electronic device and an antenna 370 formed of a coil for communication and wireless charging.

If the working fluid receives heat from the heat source 490 through the second plate 410*b* while flowing in the wick 430 in a liquefied state, the working fluid may flow in the interior space defined by the first plate 410a, the second plate 410b, and the fillers 420 in a gaseous state. When the heat of the working fluid is dissipated through the first plate 410a, the working fluid may flow in the wick 430 after the phase of the working fluid is changed to the liquefied state.

In the heat dissipation device 400, the container 410, the fillers 420, and the wick 430 may be formed of a polymeric material, the heat dissipation device 400 may prevent degradation of communication due to scattering of the frequency of an antenna, and may prevent deterioration of wireless charging efficiency even when the heat dissipation device 400 is mounted between the wireless charging transmission/reception coils. Because the specific gravity of the heat dissipation device 400 formed of a polymeric material is less than the specific gravity of the heat dissipation device formed of a metal, the weight of the heat dissipation device 400 may be light, and, because the heat dissipation device 400 has flexibility, the heat dissipation device 400 may be mounted even in a flexible device.

Referring to FIG. 4B, the shape of a wick structure 431, described below in greater detail with reference to FIG. 4D, that defines the wick 430 may be determined.

FIG. 4D is a view illustrating a shape of an inner wall of the wick structure 431 according to an embodiment.

Referring to FIG. 4D, the wick structure 431 may be formed of a polymeric material. The inner wall of the wick structure 431 may be defined as an inner wall 432a including a plurality of grooves having convexo-concave portions. The inner wall of the wick structure may be defined as an inner wall 432b having mesh-shaped grooves or convexo-concave portions. The inner wall of the wick structure 431 may be defined as an inner wall 432c formed by sintering metal powder to secure a high porosity. The wick structure 431 may be formed through a combination of the above-described inner wall structures, and may be formed to have one structure.

The wick structure 431 may include a fiber 435 at the center thereof. Fine intervals may be provided between the fiber 435 and the inner walls 432a, 432b, and 432c. The wick structure 431 may have a chemical resistance through ceramic coating or deposition, and may prevent a chemical reaction with the working fluid. The wick structure 431 may be manufactured in the form of a fiber.

The wick structure 431 may be formed of a polymeric material, such as a fluoride resin, a ceramic resin, or an epoxy, which exhibits chemical resistance and a medical chemical resistance. The wick structure 431 may have a chemical resistance through a coating of fluoride and ceramics.

Figure 5:
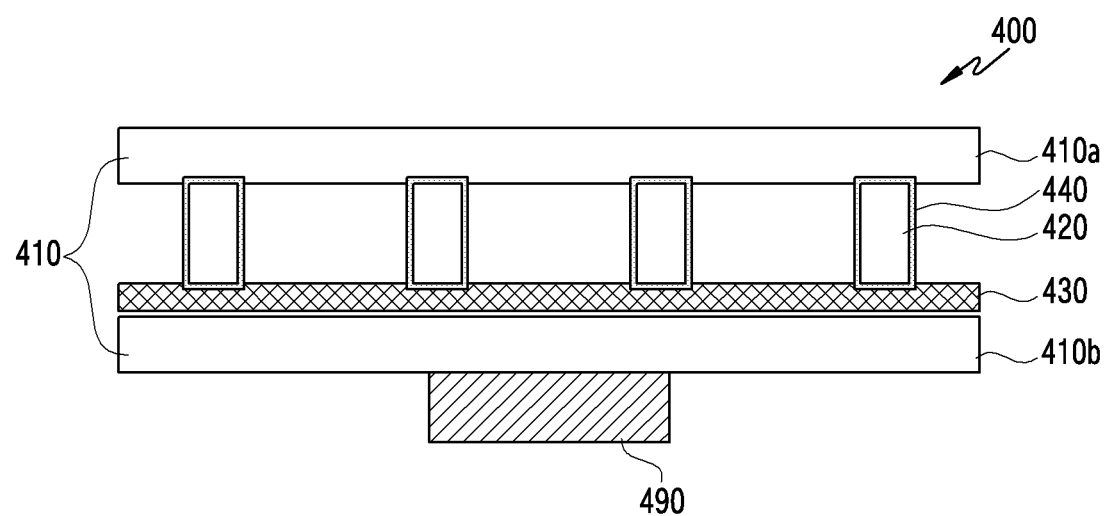
FIG. 5 is a cross-sectional view of a heat dissipation device, illustrating various structures of the heat dissipation device according to an embodiment.
Figure 6:
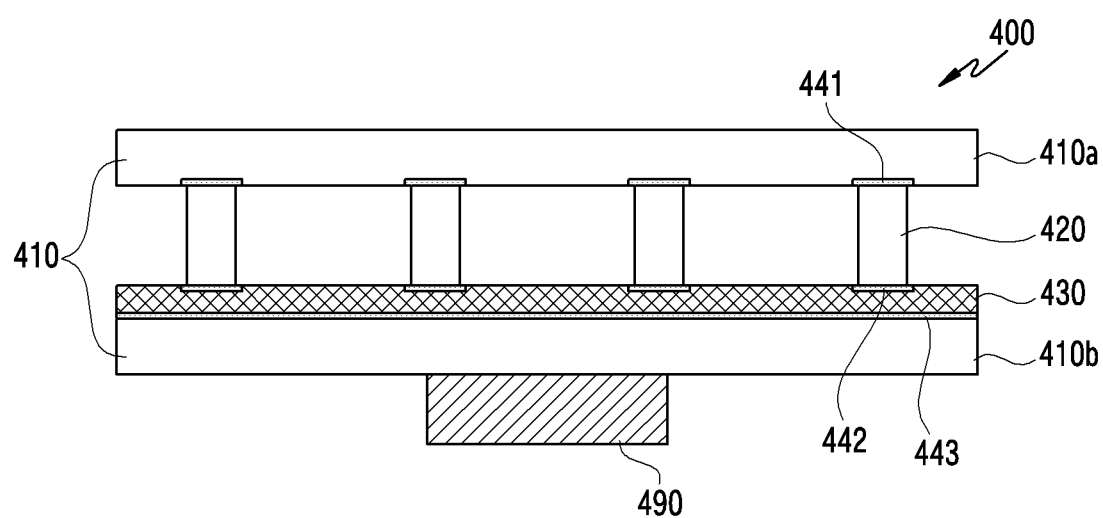
FIG. 6 is a cross-sectional view of a heat dissipation device, illustrating various structures of the heat dissipation device according to an embodiment.
Figure 7:
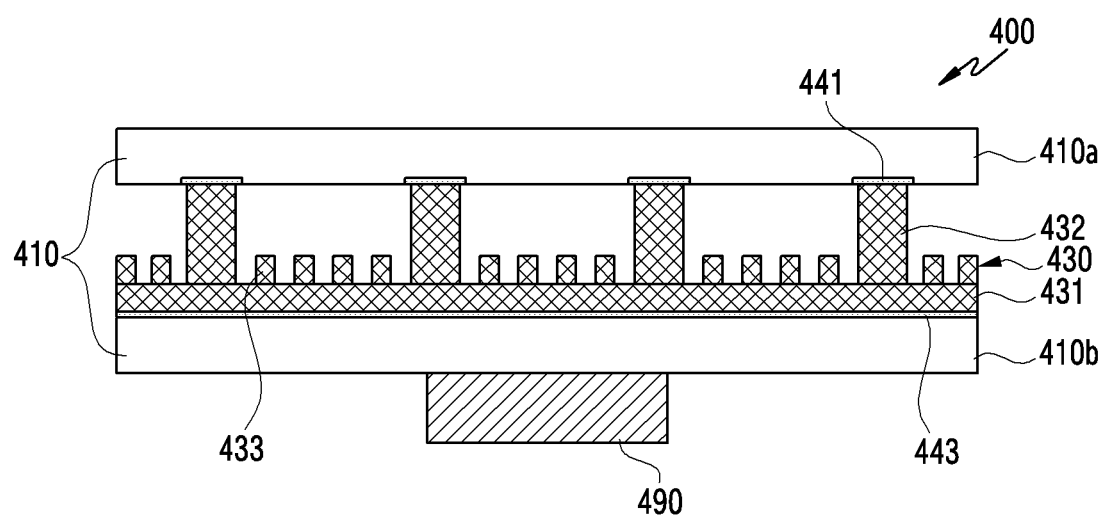
FIG. 7 is a cross-sectional view of a heat dissipation device, illustrating various structures of the heat dissipation device according to an embodiment.
Figure 8:
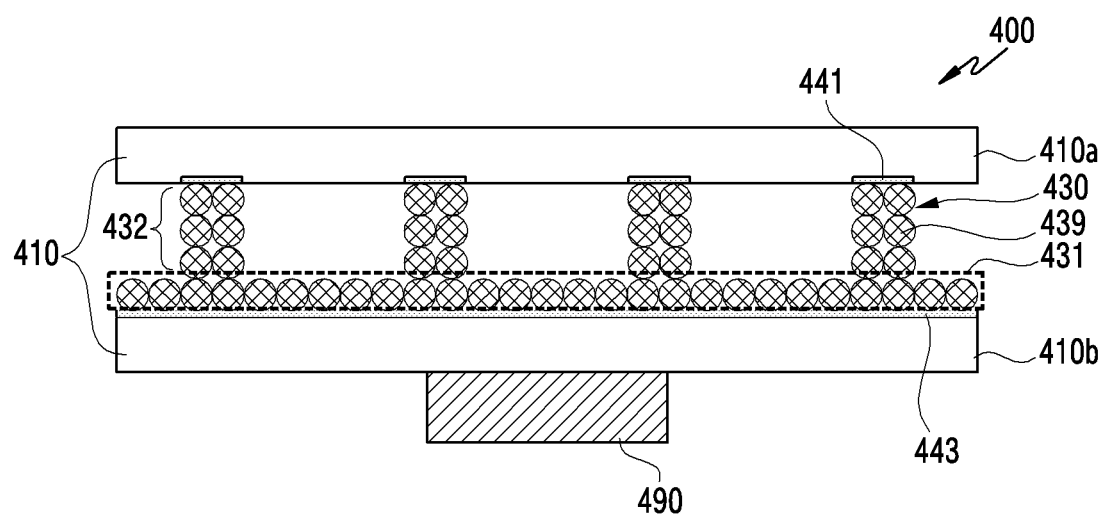
FIG. 8 is a cross-sectional view of a heat dissipation device, illustrating various structures of the heat dissipation device according to an embodiment.

FIG. 5 is a cross-sectional view of a heat dissipation device 400, illustrating various structures of the heat dissipation device according to an embodiment, FIG. 6 is a cross-sectional view of a heat dissipation device 400, illustrating various structures of the heat dissipation device according to an embodiment, FIG. 7 is a cross-sectional view of a heat dissipation device 400, illustrating various structures of the heat dissipation device according to an embodiment, and FIG. 8 is a cross-sectional view of a heat dissipation device 400, illustrating various structures of the heat dissipation device according to an embodiment.

Referring to FIG. 5, the heat dissipation device 400 may be formed to have a structure that is similar to that of the heat dissipation device of FIG. 4B. The heat dissipation device 400 may include a first plate 410a, a second plate 410b, a filler 420, and a wick 430. A heat source 490 may be disposed to face the wick 430 with the second plate 410b in which the wick 430 is interposed therebetween.

The filler 420 may be disposed between the first plate 410a and the second plate 410b to support the first plate 410a and the second plate 410b. The filler 420 may be bonded to the first plate 410a, and may be bonded to the wick 430 or the second plate 410b.

When the filler 420 extends along the first plate 410a and the second plate 410b such that the working fluid may flow in the entire wick 430, the filler 420 may be bonded to the first plate 410a and the wick 430.

The filler 420 may be manufactured of a barrier film or a polymer exhibiting a chemical resistance that is the same material as the first plate 410a and the second plate 410b constituting the container 410. When the filler 420 uses a general resin, a coating layer 440 may be formed through a method such as ceramic coating or deposition to provide a chemical resistance.

Because the filler 420, a surface of which is coated with a coating layer 440, is formed of a general resin, the filler 420 may interrupt contact with the working fluid, and may prevent generation of a non-condensable gas that may be generated due to a chemical reaction with the working fluid.

Referring to FIG. 6, a bonding relationship between the internal elements of the heat dissipation device 400 is illustrated. The heat dissipation device 400 may include a first bonding member 441 for coupling of the first plate 410a and the filler 420, a second bonding member 442 for bonding of the filler 420 and the wick 430, and a third bonding member 443 for bonding of the second plate 410b and the wick 430.

The first bonding member 441, the second bonding member 442, and the third bonding member 443 may include molecular adhesion, an atomic diffusion bond, or a silicone optical bond adhesive material.

The molecular adhesion may be possible between dissimilar materials, such as rubber and a metal, rubber and a resin, rubber and ceramics, and rubber and glass, and may be possible between nonmetallic materials. The molecular adhesion can secure a firm bonding force as well as coating of an adhesive of high concentration and a high-pressure/high-temperature environment. The atomic diffusion bond may be diffused and scattered to an object to be bonded in a gasified, liquefied, or solidified state for bonding. Because the molecular adhesion or the atomic diffusion bond may be made at a melting point or less of the object to be bonded, the molecular adhesion or the atomic diffusion bond may reduce damage to the object to be bonded.

The first bonding member 441, the second bonding member 442, and the third bonding member 443 may include a polymer-based bonding material that does not include a metallic material to prevent a chemical reaction with the working fluid.

The filler 420 may be formed of a fluoride resin, a ceramic resin, or an epoxy resin, and when the filler 420 is formed of a general resin, a coating layer 440 exhibiting a chemical resistance may be formed on a surfaced of the filler 420 as illustrated in FIG. 5.

Referring to FIG. 7, the heat dissipation device 400 may include a first plate 410a, a second plate 410b, and a wick 430. The heat source 490 may be disposed to face the wick 430 with the second plate 410b in which the wick 430 is disposed being interposed therebetween.

The wick 430 may feed the working fluid in the liquefied state through a capillary phenomenon. The wick 430 may be formed to have a wick structure 431 in which fine spaces are formed in the interior thereof. The wick 430 may be formed of a polymeric material, and the surface of the wick 430 may be treated to secure chemical resistance through ceramic coating (e.g., SiO$_2$ coating) or deposition of the surface of the wick 430 to reduce a chemical reaction with the working fluid.

The wick 430 may include a wick layer 431, a filler part 432, and protrusions 433. The filler part 432 may perform the same function as that of the fillers 420 of FIGS. 4A to 6.

The filler part 432 may function to support the first plate 410a and the second plate 410b. Because the first plate 410a and the second plate 410b are formed of a flexible polymeric material, the first plate 410a and the second plate 410b may be deflected after being used for a long time. In order to prevent deflection of the first plate 410a and the second plate 410b, the filler part 432 may define an interior space and may be disposed to be bonded to the first plate 410a.

The filler part 432 may define vapor paths for smooth flow of the working fluid. The filler part 432 may divide the interior space defined by the first plate 410a and the second plate 410b, which are spaced apart from each other. The filler part 432 may extend to be parallel to the corners of the first plate 410a and the second plate 410b. The filler part 432 may extend in the form of partition walls, and the interior space divided by the filler part 432 may be utilized as movement paths of the fluid in the gaseous state.

When the fillers 420 are formed of the filler parts 430 of the same material as the wick 430, the contact area of the working fluid with the interior space becomes Wider and the phase of the working fluid may be continuously changed. As the phase of the working fluid changes, the heat transfer efficiency of the heat dissipation device 400 may be increased.

The protrusions 433 are located between the filler parts 432, and may be formed to protrude from the surface of the wick layer 431 to the interior space by a predetermined height. The surface of the wick 430 may be formed to have convexo-concave portions due to the protrusions 433, and the surface area of the wick 430 may become larger. When the surface area of the wick 430 is large, the contact area of the working fluid with the interior space is large, and thus the phase of the working fluid may be easily changed. As the phase of the working fluid changes, the heat transfer efficiency of the heat dissipation device 400 may be increased and the heat dissipation performance may be enhanced.

If the working fluid receives heat from the heat source 490 through the second plate 410b while flowing in the wick 430 in a liquefied state, the working fluid may flow in the interior space defined by the first plate 410a, the second plate 410b, and the filler part 432 as the fluid is in a gaseous state. When the heat of the working fluid is dissipated through the first plate 410a, the working fluid may flow in the wick 430 after the phase of the working fluid is changed to the liquefied state. Because the wick 430 may include the filler part 432 and the protrusions 433, the heat transfer efficiency due to the working fluid may be increased.

Referring to FIG. 8, the heat dissipation device 400 may include a first plate 410a, a second plate 410b, and a wick 430. The heat source 490 may be disposed to face the wick 430 with the second plate 410b in which the wick 430 is interposed therebetween.

The wick 430 may include a wick layer 431 and a filler part 432. The working fluid in the liquefied state may flow in the wick 430. If heat is supplied to the working fluid, the fluid in the gaseous state may be sent to the interior space defined by the first plate 410a and the second plate 410b, which are spaced apart from each other, and if the fluid in the interior space in the gaseous state can dissipate heat such that the phase of the fluid is changed to the liquefied state, the working fluid may permeate into the wick 430.

Because the first plate 410a and the second plate 410b are formed of a flexible polymeric material, they may be deflected after being used for a long time. The filler part 432 functions to support the first plate 410a and the second plate 410b and may prevent deflection of the first plate 410a and the second plate 410b. In order to prevent deflection of the first plate 410a and the second plate 410b, the filler part 432 may define an interior space and may be disposed to be bonded to the first plate 410a.

The wick layer 431 may be bonded by the second plate 410b and the third bonding member 443, and the filler part 432 may be bonded by the first plate 410a and the first bonding member 441 to be fixed.

The wick 430 may be formed of a fine spherical powder 439. When the wick 430 is formed of the fine spherical powder 439, the surface of the wick 430 may have curves and the contact area with the interior space becomes larger, and thus it may be advantageous for the phase change of the working fluid. When the wick 430 is formed of the fine spherical powder 439, the flows of the working fluid in the interior of the wick 430 are improved, and it also may be advantageous for continuous evaporation of the working fluid.

The adhesive between the fine spherical powder 439 may be the same material as the bonding member for bonding of the first plate 410a and the filler 420 or the filler parts 430, and the first bonding member 441, and the third bonding member 443 for bonding the second plate 410b and the wick 430. The bonding of the fine spherical powder 439 may be bonded by utilizing molecular adhesion, an atomic diffusion bond, or a silicone optical bond adhesive material.

Figure 9:
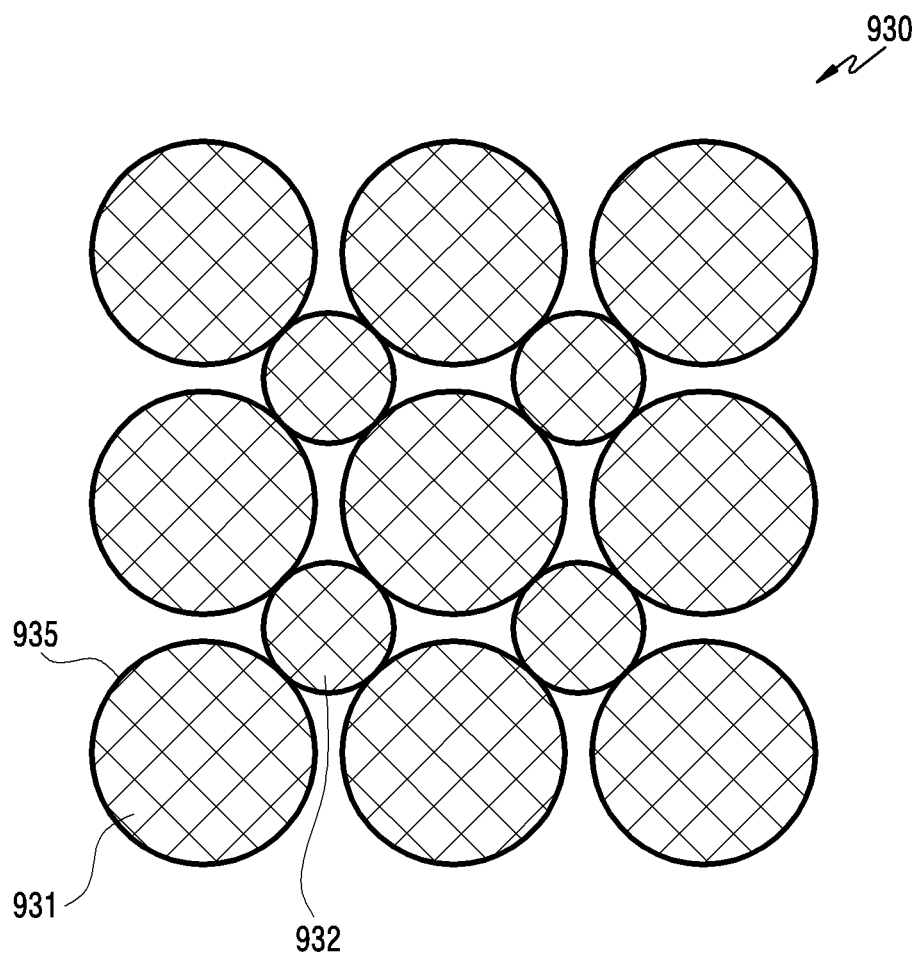
FIG. 9 is a view illustrating a wick structure of a heat dissipation device according to an embodiment.

FIG. 9 is a view illustrating a wick structure of a heat dissipation device according to an embodiment.

Referring to FIG. 9, a wick 930 may include a plurality of fine powder 931 and 932.

The fine powder may include a first fine powder 931 having larger diameters and a second fine powder 932 having smaller diameters. Apertures formed by bonding the first fine powder 931 and the second fine powder 932 having different diameters may be finely formed, and may include a larger number of pores. The plurality of fine powder 931 and 932 having a plurality of diameters may be advantageous for evaporation of the working fluid.

The first fine powder 931 and the second fine powder 932 may be formed of a fluoride resin, a fluoride-based polymer such as a fluorine polymer or a ceramic resin, or an epoxy resin. The first fine powder 931 and the second fine powder 932 may include a coating layer 935 of a material exhibiting a chemical resistance. A surface of the coating layer 935 may be treated through a method, such as ceramic coating or deposition of the first fine powder 931 and the second fine powder 932 when the coating layer 935 is formed.

The first fine powder 931 and the second fine powder 932 may be bonded or combined by using a molecular adhesion, an atomic diffusion bond, or a silicone optical bond adhesive material. The first fine powder 931 and the second fine powder 932 may be bonded to the powder of different sizes. When the powder of different sizes is bonded, larger pores may be obtained, and thus large pores may be advantageous in the phase change of the working fluid.

Figure 10A:
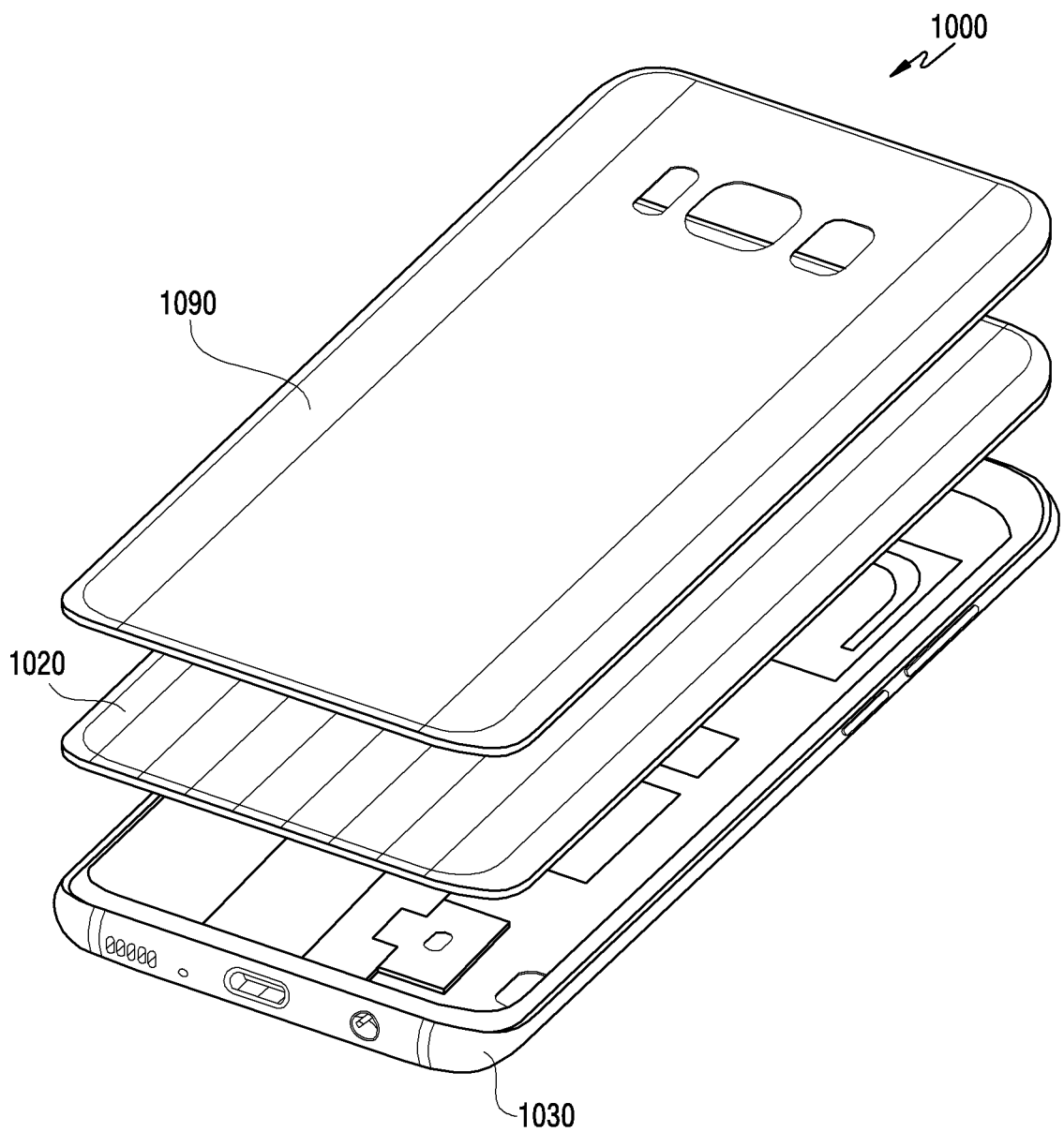
FIG. 10A is an exploded perspective view of an electronic device including a heat dissipation device according to an embodiment.
Figure 10B:
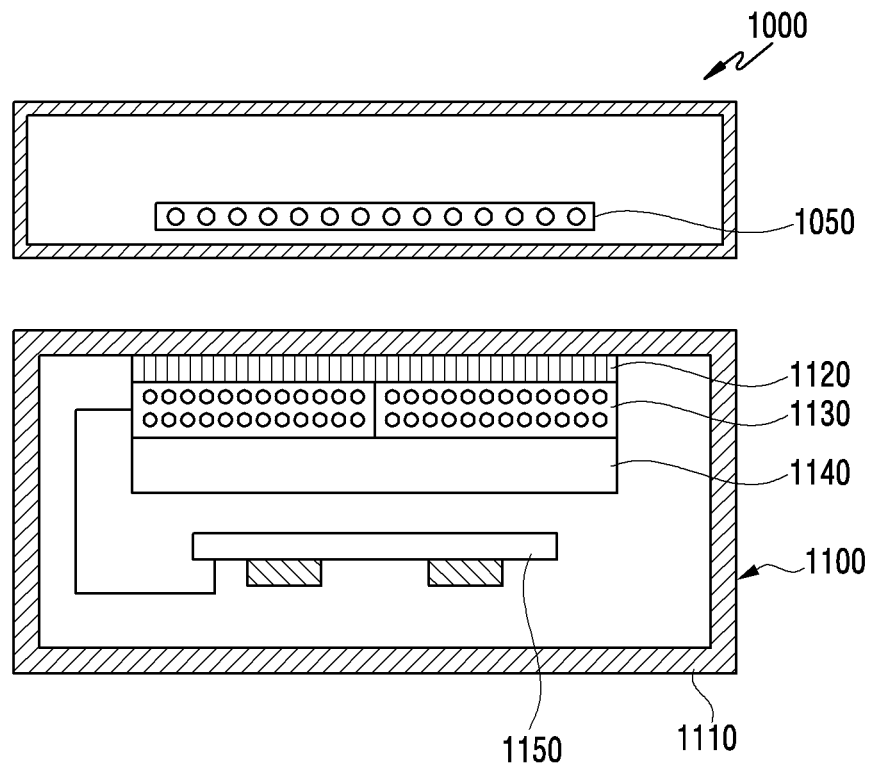
FIG. 10B is an exploded side view of an electronic device including a heat dissipation device according to an embodiment.

FIG. 10A is an exploded perspective view of an electronic device 1000 including a heat dissipation device according to an embodiment. FIG. 10B is an exploded side view of the electronic device 1000 including a heat dissipation device according to an embodiment.

Referring to FIG. 10A, the electronic device 1000 may be a mobile device. The electronic device 1000 may include a rear case 1090, a side case 1030, and a heat dissipation device 1020.

An antenna 370 including a coil for communication and a coil for wireless charging may be disposed in a surface of the side case 1030, which faces the rear case 1090. The antenna 370 may generate heat when power for charging is transmitted and received wirelessly, and heat may be generated even when communication with another device or a base station is performed. In order to dissipate heat generated in the interior of the electronic device 1000, the heat dissipation device 1020 may be disposed between the rear surface of the side case 1030 and the rear case 1090.

The heat dissipation device 1020 may be formed of a nonconductive member that is less influenced by an electromagnetic field, and may prevent deterioration of an antenna. Further, because the heat dissipation device 1020 formed of the nonconductive member is less influenced by a magnetic field, the heat dissipation device 1020 has a smaller influence on wireless charging efficiency.

Referring to FIG. 10B, the electronic device 1000 may include a first coil 1050 for wireless charging in the interior thereof, and a wireless charger 1100 may include a heat dissipation device 1120, a second coil 1130, a printed circuit board 1150, and a housing 1110, in which the components may be mounted. The second coil 1130 may be disposed on a bracket 1140 disposed in the interior of the housing 1110.

When wireless charging is performed between the electronic device 1000 and the wireless charger 1100, the second coil 1130 may generate heat. In order to reduce the amount heat that may be generated in the second coil 1130, the heat dissipation device 1120 may be disposed on the second coil 1130. Because the heat dissipation device 1120 formed of a nonconductive member is hardly influenced by the magnetic field generated by the first coil 1050 and the second coil 1130, wireless charging efficiency may be maintained.

According to an embodiment, a heat dissipation device may include a container including a first plate, and a second plate spaced apart from the first plate to define an interior space, at least one filler disposed between the first plate and the second plate and configured to support the first plate and the second plate, a wick layer located on an inner wall defined in the interior space by the first plate or the second plate, and a working fluid which flows in the interior space in a gaseous state, and flows in the wick layer in a liquefied state, where the container may include a fluoride-based polymer having a predetermined gas permeability.

The container may define side surfaces extending from edges of the first plate and the second plate to close the interior space, and the at least one filler may be disposed parallel to one side surface of the container to define a movement path of the working fluid in the gases state in the interior space of the container.

The filler may include the same material as that of the container.

The filler may include a polymer exhibiting a chemical resistance.

A ceramic coating or a deposition layer may be coated on a surface of the filler.

The filler, the container, and the wick layer may be bonded by using molecular adhesion, an atomic diffusion bond, or a silicone optical bond adhesive material.

The wick layer may include a polymeric capillary structure, through which the working fluid flows in a liquefied state.

The filler may be integrally formed with the wick layer, and may be formed of the same material and structure as those of the wick layer.

The wick layer may include a protrusion disposed between the fillers, and protrude toward the interior space.

The wick layer may include fine spherical particles.

The fine spherical particles may be coupled to each other by using molecular adhesion, an atomic diffusion bond, or a silicone optical bond adhesive material.

The fine spherical particles may include a polymeric material, and surfaces of the fine spherical particles may be treated to be chemically resistant chemical-resistance.

The wick layer may be disposed on the inner wall of the container corresponding to a surface, on which a heat source transferred from the outside is located.

According to an embodiment, an electronic device may include an electronic component, by which heat is generated during an operation thereof, and a heat dissipation device contacting a heat emitting area of the electronic component, where the heat dissipation device may include a container including a first plate, and a second plate spaced apart from the first plate to define an interior space, and including a fluorine polymer having a specific gas permeability, at least one filler disposed between the first plate and the second plate and configured to support the first plate and the second plate, a wick layer located on an inner wall defined in the interior space by the first plate or the second plate, and a working fluid which flows in the interior space in a gaseous state and flows in the wick layer in a liquefied state.

The wick layer may be located on the inner wall in contact with the heat emitting area.

The electronic component may be a display, and the heat dissipation device may be disposed on the inner wall of the container corresponding to a surface, on which the display is located.

The electronic component may be a wireless charging coil, and the heat dissipation device may be disposed on the inner wall of the container corresponding to a surface, on which the wireless charging coil is located.

The wick layer may include a polymeric capillary structure, though which the working fluid flows in the liquefied state.

The filler may be integrally formed with the wick layer, and may be formed of the same material and structure as those of the wick layer, where the wick layer may include a protrusion disposed between the fillers that protrudes toward the interior space.

The wick layer may include fine spherical particles.

In the above-described detailed embodiments of the present disclosure, a component included in the present disclosure is expressed in the singular or the plural according to a presented detailed embodiment. However, the singular form or plural form is selected for convenience of description suitable for the presented situation, but the present disclosure is not limited to a single element or multiple elements thereof. Further, either multiple elements expressed in the present disclosure may be configured into a single element or a single element in the present disclosure may be configured into multiple elements.

While the present disclosure is shown and described with reference to certain embodiments thereof, it will be understood by those skilled in the art that various changes in form and details may be made therein without departing from the scope of the present disclosure. Therefore, the scope of the present disclosure is not intended to be defined as being limited to the embodiments, but is defined by the appended claims and equivalents thereof.

What is claimed is:

1. An electronic device, comprising:
a housing including a front plate corresponding to a front surface of the electronic device, a side plate corresponding to a side surface of the electronic device, and a rear plate corresponding to a rear surface of the electronic device;
a heat dissipation device located between the front plate and the rear plate;
an antenna disposed on at least a portion in the housing and adjacent to the heat dissipation device;
wherein the heat dissipation device comprises:
a container comprising a first plate, and a second plate spaced apart from the first plate to define an interior space;
a wick structure located on an inner wall defined in the interior space by the first plate or the second plate; and
a working fluid configured to flow in the interior space in a gaseous state, and flow in the wick structure in a liquefied state,
wherein the container further comprises a fluoride-based polymer having a predetermined gas permeability,
wherein the wick structure includes a wick layer disposed on the inner wall by a bonding member, and at least one filler disposed between the first plate and the second plate and configured to support the first plate and the second plate by extending from the first plate to the second plate, and
wherein the wick layer and the at least one filler are formed of a fine spherical powder that increases a contact area of the wick structure with the interior space due to curves of the fine spherical powder, compared to the contact area when there is no fine spherical powder including curves in the wick layer and the at least one filler.

2. The electronic device of claim 1, wherein the container is further comprised to define side surfaces extending from edges of the first plate and the second plate to close the interior space, and
wherein the at least one filler is disposed parallel to one side surface of the container to define a movement path of the working fluid in the gaseous state in the interior space of the container.

3. The electronic device of claim 1, wherein the at least one filler comprises a same material as that of the container.

4. The electronic device of claim 1, wherein the at least one filler comprises a polymer exhibiting chemical resistance.

5. The electronic device of claim 1, further comprising a ceramic coating or a deposition layer coated on a surface of the at least one filler.

6. The electronic device of claim 1, wherein the at least one filler, the container, and the wick layer are bonded by molecular adhesion, an atomic diffusion bond, or a silicone optical bond adhesive material.

7. The electronic device of claim 1, wherein the wick structure comprises a polymeric capillary structure, through which the working fluid flows in the liquefied state.

8. The electronic device of claim 7, wherein the at least one filler is integrally formed with the wick layer, and is formed of a same material and structure as those of the wick layer.

9. The electronic device of claim 8, wherein the wick structure further comprises fine spherical particles.

10. The electronic device of claim 9, wherein the fine spherical particles are coupled to each other by using molecular adhesion, an atomic diffusion bond, or a silicone optical bond adhesive material.

11. The electronic device of claim 10, wherein the fine spherical particles comprise a polymeric material, and wherein surfaces of the fine spherical particles are treated to be chemically resistant.

12. The electronic device of claim 1, wherein the wick structure is disposed corresponding to a surface on which a heat source transferred from the outside is located.

13. An electronic device, comprising:
a housing including a front plate corresponding to a front surface of the electronic device, a side plate corresponding to a side surface of the electronic device, and a rear plate corresponding to a rear surface of the electronic device;
an electronic component configured to generate heat during an operation thereof;
a heat dissipation device contacting a heat emitting area of the electronic component and located between the front plate and the rear plate; and
an antenna disposed on at least a portion in the housing and adjacent to the heat dissipation device,
wherein the heat dissipation device comprises:
a container comprising a first plate, a second plate spaced apart from the first plate to define an interior space, and a fluoride-based polymer having a predetermined gas permeability;
a wick structure located on an inner wall defined in the interior space by the first plate or the second plate; and
a working fluid configured to flow in the interior space in a gaseous state, and flow in the wick structure in a liquefied state,
wherein the wick structure includes a wick layer disposed on the inner wall by a bonding member, and at least one filler disposed between the first plate and the second plate and configured to support the first plate and the second plate by extending from the first plate to the second plate, and
wherein the wick layer and the at least one filler are formed of a fine spherical powder that increases a contact area of the wick structure with the interior space due to curves of the fine spherical powder, compared to the contact area when there is no fine spherical powder including curves in the wick layer and the at least one filler.

14. The electronic device of claim 13, wherein the wick structure is in contact with the heat emitting area.

15. The electronic device of claim 13, wherein the electronic component is a display, and
wherein the heat dissipation device is disposed on the inner wall of the container corresponding to a surface on which the display is located.

16. The electronic device of claim 13, wherein the electronic component is a wireless charging coil, and
wherein the heat dissipation device is disposed on the inner wall of the container corresponding to a surface on which the wireless charging coil is located.

17. The electronic device of claim 13, wherein the wick structure comprises a polymeric capillary structure though which the working fluid flows in the liquefied state.

18. The electronic device of claim 17, wherein the at least one filler is integrally formed in the wick structure with the wick layer, and is formed of a same material and structure as those of the wick layer.

19. The electronic device of claim 17, wherein the wick structure further comprises fine spherical particles.

\* \* \* \* \*